United States Patent [19]

Heinle

[11] Patent Number: 5,316,276
[45] Date of Patent: May 31, 1994

[54] THICKNESS COMPENSATION ACTUATOR SYSTEM

[76] Inventor: Konrad Heinle, 2820 Mark Ave., Santa Clara, Calif. 95051

[21] Appl. No.: 993,773

[22] Filed: Dec. 18, 1992

[51] Int. Cl.$^5$ ............................................. B23B 31/30
[52] U.S. Cl. ........................................ 269/21; 269/61; 269/903
[58] Field of Search .................... 355/43, 45, 55; 356/358; 385/115, 411; 269/21, 61, 903

[56] References Cited

U.S. PATENT DOCUMENTS

| | | | |
|---|---|---|---|
| 3,833,230 | 9/1974 | Noll | 269/21 |
| 4,448,403 | 5/1984 | Riessland et al. | 269/21 |
| 4,491,306 | 1/1985 | Eickhorst | 269/21 |
| 4,493,555 | 1/1985 | Reynolds | 356/358 |
| 4,742,376 | 5/1988 | Phillips | 355/43 |
| 4,770,531 | 9/1988 | Tanaka et al. | 356/358 |
| 5,010,295 | 4/1991 | Lindsay | 269/21 |

Primary Examiner—Robert C. Watson

[57] ABSTRACT

A system capable of automatically compensating for the thickness of a workpiece which comprises: at least one actuator assembly which comprises a vacuum chuck capable of supporting a workpiece thereon vacuum means capable of providing the vacuum chuck with sufficient vacuum for maintain the workpiece in contact with the vacuum chuck, the vacuum means including a centrally located vacuum conduit portion, means for adjustably securing the vacuum chuck to the vacuum conduit portion, actuator means rotatably disposed about the vacuum conduit portion, and means for reciprocally moving the actuator means such that its movement produces a similar reciprocal movement by the vacuum chuck; motor means and gear assembly connected to the means for reciprocally moving the actuator means; means for detecting the thickness of the workpiece; and means for controlling the motor means and gear assembly so as to move the actuator means, whereby the height of the workpiece can be automatically and continuously adjusted to the variable thickness of the workpiece.

8 Claims, 3 Drawing Sheets

THICKNESS COMPENSATION ACTUATOR SYSTEM

The present invention relates generally to a system which is capable of automatically compensating for different thicknesses of silicon or other substrates mounted on a vacuum chuck or turntable. This system automatically detects changes in the height of the wafers caused by the different thicknesses of wafers which are being exposed by the system and automatically adjusts the height of the vacuum chuck to take into account the different thickness of each wafer loaded thereon.

BACKGROUND OF THE INVENTION

By modern semiconductor manufacturing techniques, a larger number of devices, either integrated circuits or discrete devices or thin film head, are manufactured on a single slice or wafer of semiconductor material usually 2 to 8 inches in diameter and about 18 thousandths of an inch thick. Thin film heads for Winchester disks are also made with the process using ceramic or silicon carbide substrates that range in thickness from 1 to several millimeters. The wafers and substrates are later cut into individual devices which are packaged in individual enclosures to make the finished device.

During the processing of each wafer, several patterned etching steps must be performed. The patterns are typically applied by coating the wafer with a photosensitive film which is exposed to light through an opaque mask in the shape of the desired pattern. Upon development, the remaining film forms an adherent etch resistant coating on the wafer in the pattern of the mask.

However, this automated, computer controlled alignment process does not overcome the problems which semiconductor manufactures are experiencing, particularly those in the thin film head business, with regard to the patterning of substrates with variable thicknesses. The thickness variation of the substrate or wafer often exceeds the total range of focus accommodation built into the stepper and requires that an awkward and time consuming mechanical change be made in the wafer chuck each time a new variety of device is patterned.

Conventional semi-automatic wafer thickness compensation mechanisms require that the thickness increment be manually selected. A chuck pedestal typically incorporates a manual adjustment for the wafer or substrate thickness. The thickness increments are mechanical in a precise step function. Each step has its own built-in sensor for the system's requirements.

After the operator has manually selected the desired thickness increment on the chuck pedestal the wafer is loaded onto the system by moving the stage to a wafer load slot. The wafer chuck picks up the wafer and leaves it in the up position during the coarse alignment routine. Thereafter, the stage travels out of the load slot and the moveable pedestal will retract to its down position. The system will then re-check the thickness clearance settings and, if positive, proceed underneath the air probes for the initial focus set point and begin to step and print. After completing the step pattern the stage will move toward the out slot. The moveable pedestal fully extends and the stage proceeds to an out slot and deposits the substrate on its track. Thereafter, the stage returns to the wafer load slot and a new load cycle can begin.

The present inventor has developed a fully automatic thickness compensation actuator system which overcomes the need for mechanical detection and mechanical adjustment of the pedestal when wafers of variable thicknesses are used. It allows for—automatic thickness compensation for a variety of wafer or substrate sizes by means of a computer or microprocessor controlled actuator disposed below the vacuum chuck. The thickness compensation is achieved by enabling the height of the wafer to be automatically and continuously calibrated or adjusted with respect to the variable thickness such that the upper surface of the wafer will always be in a predetermined plane.

The present invention also provides many additional advantages which shall become apparent as described below.

SUMMARY OF THE INVENTION

A system capable of automatically compensating for the thickness of a workpiece which comprises: at least one actuator assembly which comprises a vacuum chuck capable of supporting a workpiece thereon, vacuum applying means capable of providing the vacuum chuck with sufficient vacuum to maintain the workpiece in contact with the vacuum chuck, the vacuum means including a centrally located vacuum conduit portion, means for adjustably securing the vacuum chuck to the vacuum conduit portion, actuator means rotatably disposed about the vacuum conduit portion, and means for reciprocally moving the actuator means such that its movement produces a similar reciprocal movement by the vacuum chuck; motor means and gear assembly connected to the means for reciprocally moving the actuator means; means for detecting the thickness of the workpiece; and means for controlling the motor means and gear assembly so as to move the actuator means, whereby the height of the workpiece can be automatically and continuously adjusted to the variable thickness of the workpiece.

Other and further objects, advantages and features of the present invention will be understood by reference to the following specification in conjunction with the annexed drawings, wherein like parts have been given like numbers.

DESCRIPTION OF THE PREFERRED EMBODIMENTS

Figure 1:
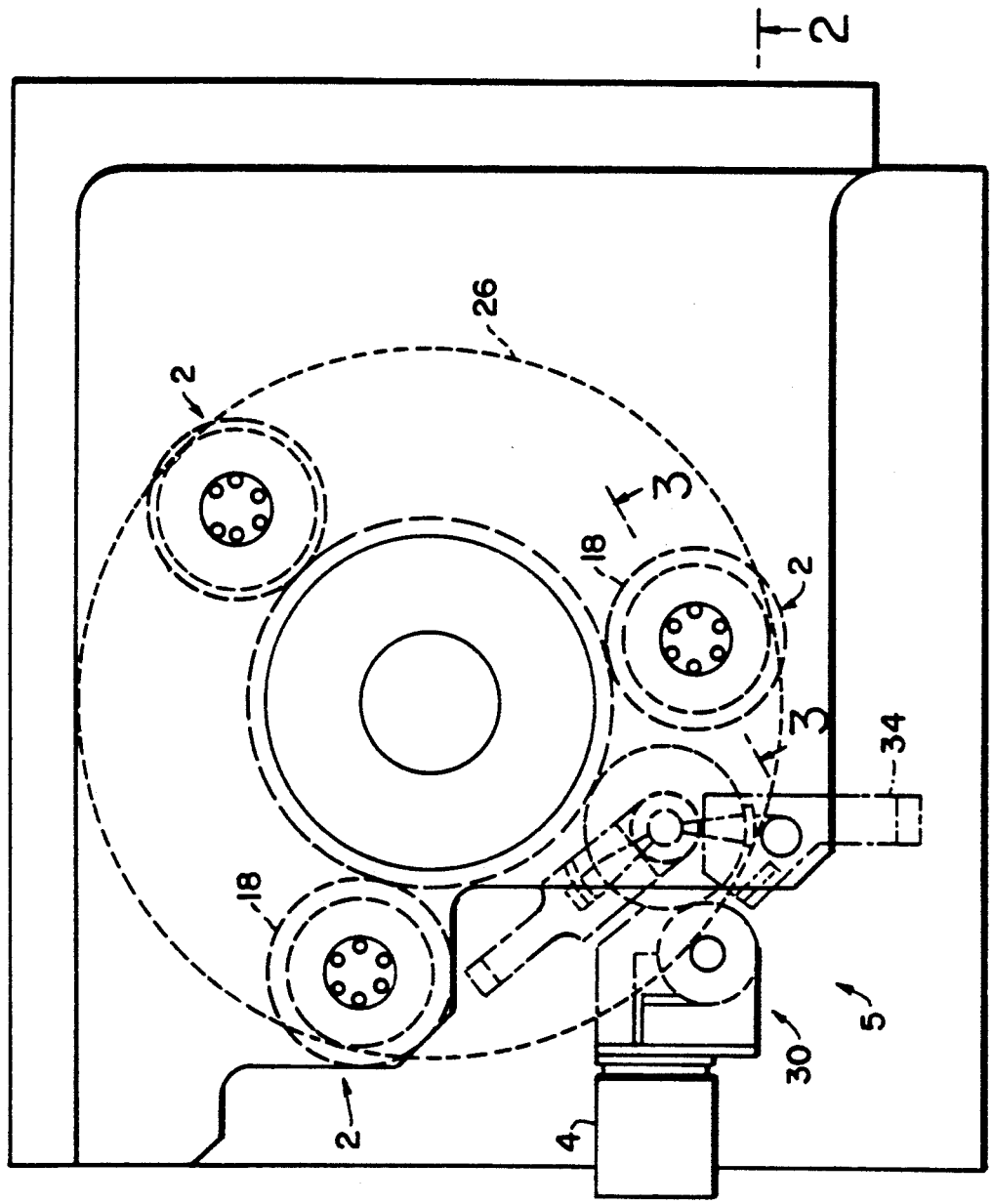
FIG. 1 is a schematic top plan view of a system according to the present invention which is capable of automatically compensating for the thickness of a workpiece disposed thereon.
Figure 2:
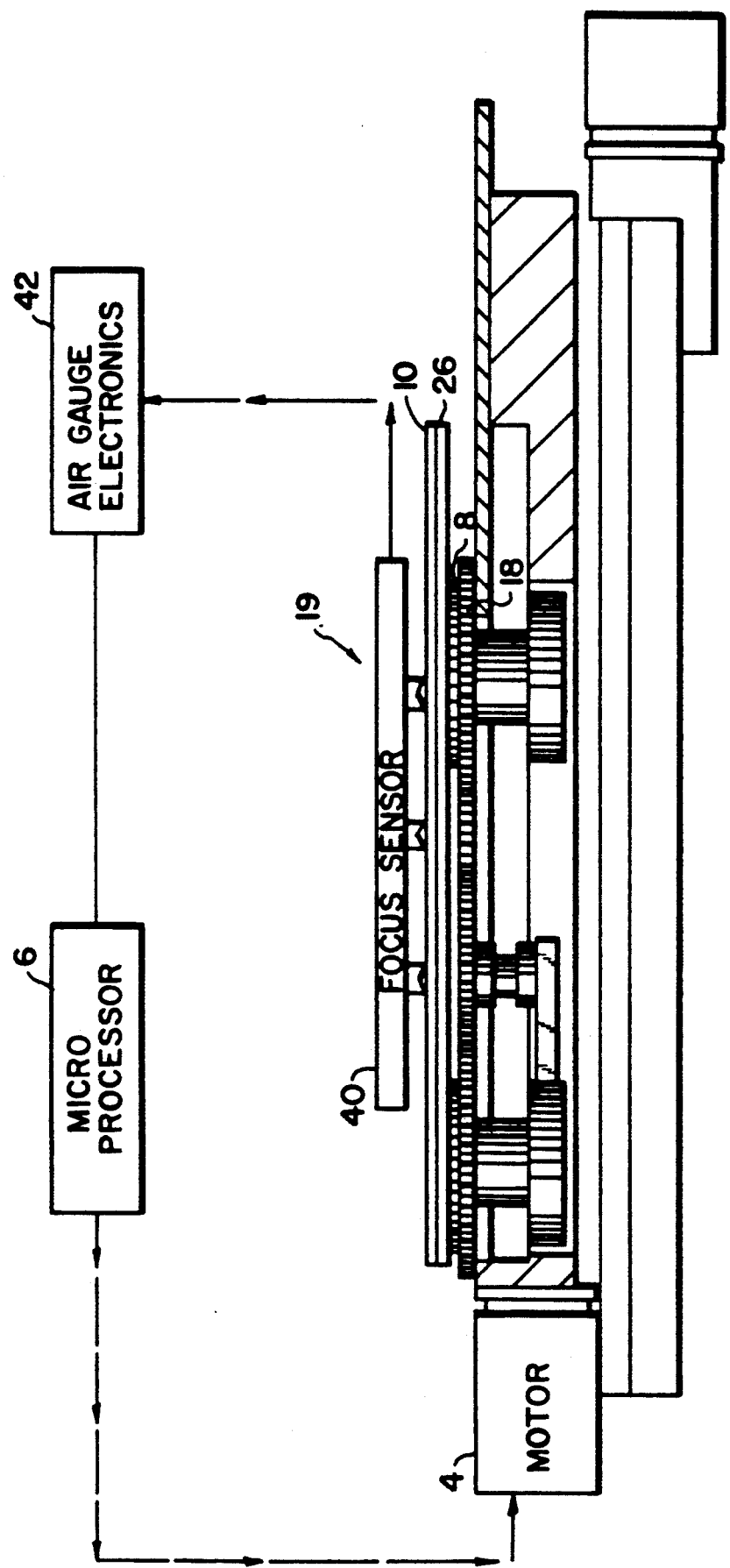
FIG. 2 is a cross-sectional view along line 2—2 of FIG. 1 together with a schematic diagram showing the means for detecting the thickness of the workpiece and the means for controlling the motor according to the thickness detected.
Figure 3:
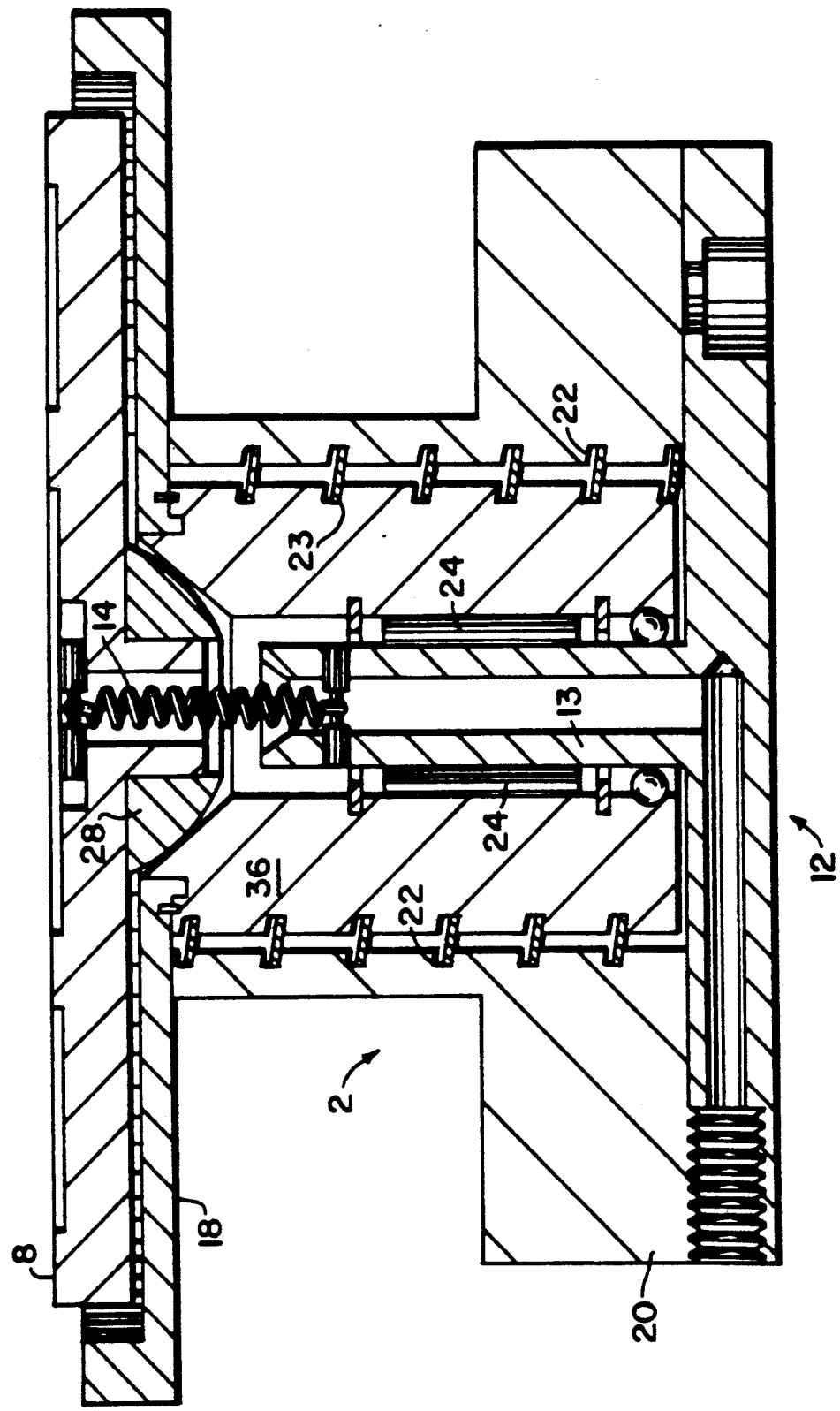
FIG. 3 is a cross-sectional view of an actuator assembly along line 3—3 of FIG. 1.

The present invention can best be described by referring to the attached drawings wherein FIGS. 1-3 a depict novel system which is capable of automatically compensating for the variable thickness of a workpiece, such as a silicon wafer.

The system comprises at least one actuator assembly 2, including three individual actuators equally spaced from each other, a motor means 4, a gear means or assembly 5, a means for detecting the thickness of the workpiece 40, 42, and a means 6 for controlling the motor means and gear assembly so as to move the actuator means in accordance with the variable thickness of the workpiece, e.g., a wafer 10.

The actuator assembly 2 preferably comprises a vacuum chuck 8 which is capable of supporting a much larger wafer chuck 26 that in turn supports a wafer 10 thereon, vacuum applying means 12 which is capable of providing a vacuum chuck 8 with sufficient vacuum for maintaining wafer 10 in contact with wafer chuck 26 and wafer chuck 26 in contact with vacuum chuck 8. Vacuum applying means 12 includes a centrally located conduit portion 13, spring means 14 for adjustably securing vacuum chuck 8 to vacuum conduit portion 13, actuator means 16 rotatably disposed about vacuum conduit portion 13, and means 18 for reciprocally moving the actuator means such that its movement produces a similar reciprocal movement by vacuum chuck 8, whereby the height of workpiece 10 can be automatically and continuously adjusted in dependence on the thickness of the workpiece such that the upper surface of any given workpiece will always be in a predetermined (e.g., focal) plane.

Means 18 which is capable of reciprocally moving actuator means 16 is preferably an actuator gear means connected to actuator means 16. Actuator means 16 is disposed within a support means 20 such that, as actuator gear means 18 is rotated, actuator means 16 moves along the inner surface of support means 20 by means of a female screw threading 22 on each of the two confronting surfaces. Consequently, actuator means 16 is capable of reciprocal up and down movement along the inner surface of support means 20, it being preferable to use a spring 23 between actuator means 16 and support means 20 to enhance this reciprocal movement between the mobile actuator means 16 and the stationary support means 20.

It is also preferable to place at least one bearing 24 between vacuum conduit portion 13 and actuator means 16 to assist in the reciprocal movement of actuator means 16. According to the preferred embodiment, it is desirable that the reciprocal movement of actuator means 16 be both rotational and longitudinal with respect to vacuum conduit portion 13.

In order to ensure that vacuum chuck 8 is constantly planar with respect to wafer chuck 26, a swivel means 28 is disposed between vacuum chuck 8 and actuator means 16. The vacuum chuck 8 and swivel means 28 are adjustably secured to vacuum conduit portion 13 by spring means 14. It is also preferable that a wafer chuck 26 be disposed between vacuum chuck 8 and workpiece 10.

The gear means or assembly 5 preferably includes a gear box 30, a central ring gear 32, and a limit switch assembly 34 disposed between gear box 30 and central ring gear 32. Central ring gear 32 is preferably in simultaneous contact with each actuator gear means 18 of the respective actuator assembly 2 such that each actuator gear means 18 moves in the same direction and distance as any other associated actuator gear means 18.

The means 19 for detecting the thickness of the workpiece is a sensor means which comprises an air gauge focus sensor array 40 and an air gauge electronic package 42. The means 6 for controlling motor means 4 and the gear assembly 5 is a microprocessor which is electrically connected to both motor means 4 and the means for detecting the thickness of a workpiece.

According to the present invention, whenever a new set of substrate thicknesses need to be accommodated, focus sensor electronics 42 will detect a change in the air gap between air gauge focus sensor 40 and workpiece 10. This change in the air gap will then be communicated to a microprocessor 6 which will then signal stepper motor 4 to activate. Stepper motor 4 will activate gear box 30 which in turn activates limit switch assembly 34. Limit switch assembly 34 then causes the central ring gear 26 to move in either a forward or reverse direction. Central ring gear 26 will then simultaneously move all connected actuator gears 18 in the same direction. Therefore, the direction of rotation of the central ring gear will cause the actuator gears to move the actuator means either up or down in accordance with the change in the air gap such that the upper surface of the workpiece is always at the same focal point within the system.

While I have shown and described several embodiments in accordance with my invention, it is to be clearly understood that the same are susceptible to numerous changes apparent to one skilled in the art. Therefore, I do not wish to be limited to the details shown and described but intend to show all changes and modifications which come within the scope of the appended claims.

What is claimed is:

1. A thickness compensation actuator system for enabling automatic, coarse adjustment of wafer height in combination with a stepper mechanism for imposing image patterns on said wafer which comprises:

a vacuum chuck capable of supporting a wafer thereon;

vacuum applying means capable of providing said vacuum chuck with sufficient vacuum to maintain said wafer in contact with said vacuum chuck, said vacuum applying means including a centrally located vacuum conduit portion;

means for adjustably securing said vacuum chuck to said vacuum applying means;

an actuator means rotatably disposed about said vacuum conduit portion; and means, including a motor, for reciprocally moving said actuator means such that its movement produces a similar reciprocal movement by said vacuum chuck; and feedback means, including a focus sensor means, a microprocessor, and said motor, said feedback means being operative for automatically, coarsely adjusting the height of said vacuum chuck in response to the thickness variation of said wafer, such that the upper surface of said wafer will lie in a predetermined plane, said thickness variation exceeding the total range of focus accommodation built into the stepper mechanism.

2. The system according to claim 1, further comprising a support means disposed about said actuator means such that said actuator means is capable of reciprocally moving along the inner surface of said support means.

3. The system according to claim 1, wherein a spring is disposed between female threading on said actuator means and female threading on said support means to permit continuous reciprocal movement by said actuator means along the inner surface of the support means.

4. The system according to claim 1, further comprising a swivel means disposed between said vacuum chuck and said actuator means.

5. The system according to claim 1, wherein said means for adjustably securing said vacuum chuck to said vacuum conduit portion is a spring means.

6. The system according to claim 1, wherein said means for reciprocally moving said actuator means is a gear means connected to said actuator means.

7. The system according to claim 1, further comprising a wafer chuck disposed between said vacuum chuck and said wafer.

8. The system according to claim 1, wherein said focus sensor means comprises an array of air gauge focus sensors spaced from said wafer.

* * * * *